United States Patent [19]
von Bunau et al.

[11] Patent Number: 5,438,204
[45] Date of Patent: Aug. 1, 1995

[54] TWIN-MASK, AND METHOD AND SYSTEM FOR USING SAME TO PATTERN MICROELECTRONIC SUBSTRATES

[75] Inventors: Rudolf M. von Bunau, Mountain View; Roger F. W. Pease, Stanford, both of Calif.

[73] Assignee: The Board of Trustees of the Leland Stanford, Jr. University, Stanford, Calif.

[21] Appl. No.: 175,977
[22] Filed: Dec. 30, 1993
[51] Int. Cl.$^6$ ............................................. H01J 1/52
[52] U.S. Cl. ............................ 250/492.2; 250/492.22; 430/5
[58] Field of Search .................. 250/492.2, 492.22; 430/5; 378/35

[56] References Cited

U.S. PATENT DOCUMENTS

| | | | |
|---|---|---|---|
| 4,812,662 | 4/1989 | Goto et al. | 250/492.2 |
| 4,899,060 | 2/1990 | Lischke | 250/492.2 |
| 5,320,918 | 6/1994 | Raab et al. | 430/5 |
| 5,334,282 | 8/1994 | Nakayama et al. | 250/492.2 |

FOREIGN PATENT DOCUMENTS 0453753  10/1991  European Pat. Off. .

OTHER PUBLICATIONS

*Markle-Dyson Optics for 0.25 μm Lithography and Beyond*, A. Grenville et al.; J. Vac. Sci. Technol. B9(6), Nov./Dec. 1991, pp. 3108–3112.
*Silicon-on-Quartz Reflective Masks for 0.25-μm Microlithography*, Y. H. Lee et al.; J. Vac. Sci. Technol. B9(6), Nov./Dec. 1991, pp. 3138–3142.
*Improving Resolution in Photolithography With a Phase-Shifting Mask;* M. D. Levenson et al.; IEEE Transactions on Electron Devices, vol. ED-29, No. 12, Dec. 1982, pp. 1828–1836.
*The Phase-Shifting Mask II: Imaging Simulations and Submicrometer Resist Exposures,* M. D. Levenson et al.; IEEE Transactions on Electron Devices, vol. ED-31, No. 6, Jun. 1984, pp. 753–763.
*Optimization of Real Phase Mask Performance,* F. Schellenberg et al.; SPIE vol. 1604 11th Annual BACUS Symposium on Photomask Technology (1991), pp. 274–296.
*New Imaging Technique for 64M-DRAM,* N. Shiraishi et al.; SPIE vol. 1674 Optical/Laser Microlithography V(1992), pp. 741–752.
*Spatial Filtering for Depth of Focus and Resolution Enhancement in Optical Lithography,* H. Fukuda et al.; J. Vac. Sci. Technol. B9(6), Nov./Dec. 1991, pp. 3113–3116.
*Evaluation of Pupil-Filtering in High-Numerical Aperture I-Line Lens,* H. Fukuda et al.; Jpn. J. Appl. Phys. vol. 32(1991) Pt. 1, No. 12B, Dec. 1993, pp. 5845–5849.
*A New Method for Enhancing Focus Latitude in Optical Lithography: FLEX,* H. Fukuda et al.; IEEE Electron Device Letters, vol. EDL-8, No. 4, Apr. 1987, pp. 179–180.
*Improvement of Defocus Tolerance in a Half-Micron Optical Lithography by the Focus Latitude Enhancement Exposure Method: Simulation and Experiment,* H. Fukuda et al.; J. Vac. Sci. Technol. B7(4), Jul./Aug. 1989, pp. 667–674.
*Modeling and Experimental Verification of Illumination and Diffraction Effects on Image Quality in X-Ray Lithography,* Scott D. Hector et al.; J. Vac. Sci. Technol. B 10(6), Nov./Dec. 1992, pp. 3164–3168.

*Primary Examiner*—Jack I. Berman
*Assistant Examiner*—James Beyer
*Attorney, Agent, or Firm*—Bell, Seltzer, Park & Gibson

[57] ABSTRACT

A microelectronic substrate patterning system and method uses two or more copies of a mask pattern in the radiation path between the radiation source and the microelectronic substrate. The two or more copies are axially displaced from one another along the radiation path and are in axial alignment with each other along the radiation path. Thus, the mask pattern is imaged onto the microelectronic substrate as a result of interaction of the radiation with the multiple copies of the mask pattern in the radiation path. The mask pattern thereby images at an increased depth to focus compared to a single copy of the mask pattern. The two or more copies of the mask pattern may be used to increase the depth of focus of transmissive and reflective microelectronic substrate imaging systems. The mask copies may be identical or may be biased relative to the desired feature dimensions. Conventional microelectronic techniques may be used to fabricate the mask and to ensure alignment between the first and second copies of the microelectronic substrate mask pattern.

30 Claims, 5 Drawing Sheets

TWIN-MASK, AND METHOD AND SYSTEM FOR USING SAME TO PATTERN MICROELECTRONIC SUBSTRATES

FIELD OF THE INVENTION

This invention relates to microelectronic device manufacturing systems and methods, and more particularly to microelectronic substrate imaging systems and methods.

BACKGROUND OF THE INVENTION

Microelectronic substrates are widely used in many consumer, industrial and other products. As used herein, microelectronic substrates include semiconductor substrates such as semiconductor wafers and integrated circuit chips, and also include nonsemiconductor microelectronic substrates such as second level packages for integrated circuit chips, and other nonsemiconductor microelectronic devices such as thin film read/write heads for magnetic disks, or display devices.

In fabricating microelectronic substrates, it is often necessary to pattern an image thereon. Photolithography is frequently used for patterning an image on a microelectronic substrate. In a microelectronic substrate imaging system and method, such as a photolithographic system and method, radiation is directed along a radiation path from a radiation source to a microelectronic substrate to be patterned. Typically, a mask is placed in the radiation path between the source and the microelectronic substrate. The mask includes a mask pattern of areas which are transparent and opaque to the radiation, so that the mask pattern impinges on the substrate. Typically, a photosensitive layer such as a resist is placed on the microelectronic substrate so that an image of the mask pattern is formed in the photosensitive layer. The image so formed may then be used for performing lithography or other processes on the underlying microelectronic substrate. Microelectronic imaging systems typically use optical radiation in the visible or ultraviolet spectrum, but may also use radiation in the x-ray or other spectra.

Conventional microelectronic imaging systems use a transmissive mask, such that the radiation source is on one side of the mask, the microelectronic substrate is on the opposite side of the mask, and radiation passes through the mask in the radiation path from the source to the substrate. It has also been proposed to design reflective-mask imaging systems wherein the radiation source and the microelectronic substrate are both on the same side of the mask and wherein radiation impinging on the mask from the radiation source is reflected from the mask to the microelectronic substrate. One such reflective-mask system is known as the "Markle-Dyson" optical projection system and is described in Grenville et al., *Markle-Dyson Optics for 0.25 μm Lithography and Beyond*, J. Vac. Sci. Technol., B9, page 3108 (1991) and in Lee et al., *Silicon on Quartz Reflective Masks for 0.25 μm Microlithography*, J. Vac. Sci. Technol., B9, page 3138 (1991).

In order to produce high density microelectronic devices on microelectronic substrates, it is necessary to provide a high resolution microelectronic substrate imaging system. In particular, state of the art microelectronic devices are presently fabricated with sub-micron design rules. For future sub-micron technologies, higher resolution of microelectronic substrate imaging systems will be needed.

Improved resolution can be achieved through the use of lower wavelengths of radiation and/or a higher numerical aperture in the imaging system. Both of these techniques decrease the depth of focus which is available in the microelectronic imaging system. This tradeoff is quantitatively described by Rayleigh's formula which states that the depth of focus is proportional to the wavelength of the radiation used and inversely proportional to the square of the numerical aperture of the imaging system.

A certain amount of depth to focus is needed in high resolution microelectronic substrate imaging systems in order to overcome a number of inherent uncertainties in the imaging process. These inherent uncertainties include nonplanarity of the microelectronic substrate, nonplanar topography of already patterned layers on the surface of the microelectronic substrate, finite resist thickness and focusing uncertainty in the imaging system.

Many solutions have been proposed to increase the depth of focus in microelectronic imaging systems, each with their own set of advantages and drawbacks. For example, phase shifting masks have been proposed. Phase shifting masks can increase the depth of focus through the use of transparent features which introduce a phase delay in certain areas of the mask. Unfortunately, the automated design of phase shifting masks suitable for general pattern types appears to be an exceedingly difficult task. Phase shifting masks are described in the following publications: *Improving Resolution in Photolithography with a Phase-Shifting Mask*, M. D. Levenson et al., IEEE Transactions on Electron devices ED-29, 1828 (1982); *The Phase Shifting Mask II: Imaging Simulations and Submicrometer Resist Exposures*, M. D. Levenson et al., IEEE Transactions on Electron Devices, ED-31, 753 (1984); *Optimization of Real Phase Mask Performance*, F. M. Schellenberg et al., 11th Annual Symposium on Photomask Technology, Proceedings of the SPIE 1604, 274 (1992).

Another approach for increasing the depth of focus is referred to as "modified illumination". Modified illumination can increase the depth of focus by changing the spatial coherence properties of the radiation incident on the mask. One particular modified illumination scheme is described in a publication entitled *New Imaging Technique for 64M-DRAM*, N. Shiraishi et al., Optical/Laser Microlithography V. Proceedings of the SPIE 1674, pt. 2, 741 (1992).

Another approach for increasing depth of focus is referred to as "pupil plane filtering" or "apodization". This technique can be used to increase the depth to focus by filtering the angular spectrum of the projected image. Unfortunately, the increase in depth of focus is achieved at the expense of degrading contrast, and the technique requires a redesign of the imaging system to incorporate a pupil filter. Pupil plane filtering is described in the following publications: *Spatial Filtering for Depth of Focus and Resolution Enhancement in Optical Lithography*, H. Fukuda et al., J. Vac. Sci. Technol. B9, 3113 (1991); and *Evaluation of Pupil Filtering in High NA I-line Lens*, H. Fukuda et al., presented at the MicroProcess Conference, July 1993 (to be published).

Another technique for increasing the depth of focus uses multiple exposures at different focus levels. This technique, referred to as "focus latitude enhancement exposure" (FLEX) uses multiple, sequential exposures at different focus settings and at suitably selected doses. The multiple sequential exposures are superimposed and added in the resist. Unfortunately, since the multiple images are added in the resist on an intensity basis, a decrease in image contrast results. Production throughput may also decrease due to the need for multiple sequential exposures. The FLEX technique is described in the following publications: *A New Method for Enhancing Focus Latitude in Optical Lithography: FLEX*, H. Fukuda et al., IEEE Electron Device Letters EDL-8, 179 (1987); and *Improvement of Defocus Tolerance in Half-Micron Optical Lithography by the Focus Latitude Enhancement Exposure Method: Simulation and Experiment*; H. Fukuda, J. Vac. Sci. Technol. B7, 667 (1989).

Another technique has been used to reduce the depth of focus necessary because of the topography of the microelectronic substrate. This technique uses a "three-dimensional" or "topography compensated" mask. The three-dimensional mask includes a single mask pattern which follows the topography of the microelectronic substrate. Since the mask follows the substrate topography, the depth of field need not be increased to accommodate the topography. Topography compensated masks are described in Published European Patent Application No. 0 453 753 A2 to Hakey et al. entitled *Method and Apparatus for Enhancing the Depth of Focus in Projection Lithography*.

It has also been pointed out that for proximity printing systems, such as X-ray lithography systems, the non-zero thickness of the absorber material has a beneficial effect on the contrast and the exposure latitude. See Hector et al., *Modeling and Experimental Verification of Illumination and Diffraction Effects on Image Quality in X-Ray Lithography*, J. Vac. Sci. Technol. B9, page 3164 (1992).

In summary, high resolution microelectronic substrate imaging systems and methods sacrifice depth of focus in order to achieve high resolution. Techniques have been devised to regain at least some of the lost depth of focus, but may introduce problems of their own. Accordingly, there is a need to increase the depth of focus in a high resolution microelectronic substrate imaging system and method, without requiring excessively complex mask design procedures, redesign of the projection system, or decreasing the contrast of the image to an unacceptable degree.

SUMMARY OF THE INVENTION

It is therefore an object of the present invention to provide improved systems and methods for patterning microelectronic substrates.

It is another object of the present invention to provide systems and methods for patterning microelectronic substrates which allow high resolution patterning of microelectronic substrates while maintaining an acceptable depth of focus.

It is yet another object of the present invention to provide increased depth of focus in microelectronic substrate imaging systems and methods without requiring redesign of the imaging system.

It is still another object of the present invention to provide high resolution microelectronic substrate patterning systems and methods which do not require complex mask design procedures.

These and other objects are provided, according to the present invention, by a microelectronic substrate patterning system and method which uses two or more copies of a mask pattern in the radiation path between the radiation source and the microelectronic substrate. The two or more copies are axially displaced from one another along the radiation path and are in axial alignment with each other along the radiation path. Thus, the mask pattern images onto the microelectronic substrate as a result of interaction of the radiation with the multiple copies of the mask pattern in the radiation path. The mask pattern thereby images at an increased depth of focus compared to a single copy of the mask pattern.

A mask according to the present invention will be referred to herein as a "twin-mask". The twin-mask includes a first mask layer having a first copy of a microelectronic substrate mask pattern therein. A second mask layer having a second copy of the same microelectronic substrate mask pattern is also included. The first and second copies of the microelectronic substrate mask pattern are supported in closely spaced apart relation to one another and aligned relative to one another. The separation distance between the first and second copies of the microelectronic substrate mask pattern is preferably on the order of the desired depth of focus multiplied by the square of the magnification of the imaging system. Although the term "twin-mask" is used herein, and a mask having a first mask layer and a second mask layer is described, it will be understood by those having skill in the art that more than two copies of the microelectronic substrate mask pattern may be used in closely spaced apart relation to each other and axially aligned relative to one another.

As described above, the first mask layer and the second mask layer of the twin-mask include a first and second copy, respectively, of the same microelectronic substrate mask pattern. The first copy may be of the same shape and size as the second copy. Alternatively, the first copy may be of the same general shape as the second copy but certain features may be "biased", i.e. undersized or oversized with respect to the desired size of the patterned feature.

The first and second copies of the microelectronic substrate mask pattern are supported in closely spaced apart relation to one another and aligned relative to one another. They may be supported by a radiation transmissive spacer layer between the first and second copies of the mask pattern. The twin-mask may also be formed on a transmissive substrate. Alternatively, the first and second copies of the microelectronic substrate mask pattern may each be formed on a separate substrate and held in closely spaced apart relation to one another and aligned relative to one another by a frame. In either embodiment, at least one of the mask layers may include alignment marks to facilitate alignment of the first and second copies relative to one another.

The twin-mask may be used in reflective and transmissive microelectronic substrate patterning systems and methods. For transmissive imaging, the first copy is an at least partially absorbing copy of the microelectronic substrate mask pattern and may be a fully absorbing copy. The second copy is an at least partially absorbing copy of the microelectronic substrate mask pattern and may be a fully absorbing copy. In a reflective system, the first copy is an at least partially reflecting copy of the microelectronic substrate mask pattern and may be a fully reflecting copy. The second copy is an at least partially reflecting copy of the microelectronic substrate mask pattern and may be a completely reflecting copy of the microelectronic substrate mask pattern. By completely reflecting it is meant that the reflectivity approaches the bulk reflectivity of the material. Fully and partially transmitting and reflective patterns may be formed using conventional mask forming techniques, using well known materials.

A method and system for patterning a microelectronic substrate, according to the invention, interposes a first copy of a mask pattern and second copy of the same mask pattern in a radiation path from a radiation source to a microelectronic substrate holder, in axially spaced apart relation to one another along the radiation path and in axial alignment to one another along the radiation path. When radiation is directed from the radiation source along the radiation path to the microelectronic substrate holder which includes a microelectronic substrate coupled thereto, the mask pattern is patterned onto the microelectronic substrate as a result of interaction of the radiation with both the first copy and the second copy of the mask pattern in the radiation path.

In a transmissive microelectronic substrate patterning system and method, the first mask copy is an at least partially absorbing copy of the mask pattern and may be a fully absorbing copy, and the second copy of the mask pattern is an at least partially absorbing copy and may be a fully absorbing copy. The second copy is closer to the microelectronic substrate than the first copy, to produce transmissive imaging. Stated differently, radiation first impinges upon the first copy, then upon the second copy. In a reflective microelectronic substrate patterning system and method, the first copy of the mask is an at least partially reflecting copy of the mask pattern and may be a totally reflecting copy, and the second copy of the mask is an at least partially reflecting and may be a totally reflecting copy of the mask pattern. The first copy is closer to the source of radiation than the second copy, to produce reflective imaging. Stated differently, radiation first impinges upon the first copy, then upon the second copy.

A twin-mask according to the present invention may be fabricated using a series of conventional mask making steps. Mask design is not substantially more difficult than a conventional mask because the twin-mask includes only replicated copies of the microelectronic substrate mask pattern. Fabrication is of comparable difficulty to the fabrication of most kinds of phase shifting masks. According to one method, a first mask layer including a first copy of a microelectronic substrate mask pattern therein is formed on a transparent substrate. A transparent spacing layer is then formed on the first mask layer opposite the transparent substrate. A second mask layer including a second copy of the same microelectronic substrate mask pattern is formed on the transparent spacing layer opposite the first mask layer and aligned relative to the first copy of a microelectronic substrate pattern. The first mask layer may include alignment marks therein, to facilitate subsequent alignment of the second mask layer.

A twin-mask imaging system and method of the present invention increases depth of focus without sacrificing resolution. It does not require complicated mask design procedures as do phase shifting masks. It does not require modification or redesign of the imaging system as in the modified illumination and pupil plane filtering techniques. The twin-mask is of comparable design complexity as a conventional single copy mask, and of comparable fabrication complexity to most phase shifting masks.

DETAILED DESCRIPTION OF PREFERRED EMBODIMENTS

Figure 1A:
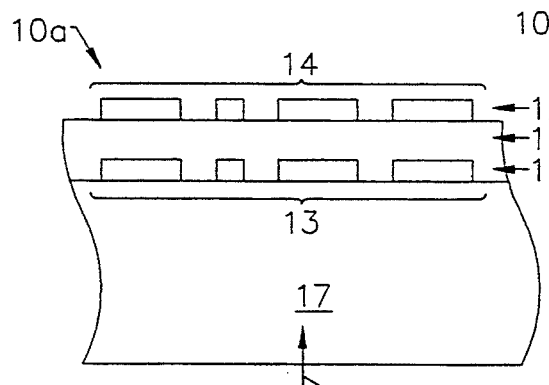
FIGS. 1A and 1B illustrate side cross-sectional views of a first embodiment of a transmissive twin-mask and a reflective twin-mask, respectively, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1B:
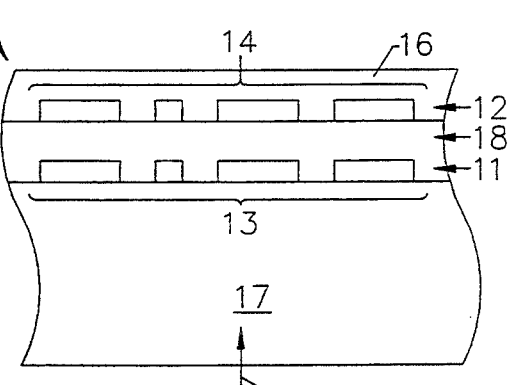

Referring now to FIGS. 1A and 1B, a first embodiment of a transmissive and a reflective twin-mask, respectively, according to the present invention, is shown. As illustrated, twin-masks 10a and 10b comprise a first mask layer 11 including a first copy 13 of a microelectronic substrate mask pattern therein. Twin-masks 10a and 10b also include a second mask layer 12 which has a second copy 14 of the same microelectronic substrate mask pattern therein. Supporting means, such as a transmissive spacing layer 18, is provided for supporting the first and second copies of the microelectronic substrate mask pattern in closely spaced apart relation to one another.

As shown, the first and second copies of the mask pattern 13 and 14 are aligned to one another relative to the opposing faces of the mask 10. Also shown in FIGS. 1A and 1B is substrate 17, which protects the mask and provides a substrate for fabrication of the mask as is well known to those having skill in the art. The reflective mask 10b also includes an absorbing layer 16 on second mask layer 12. An optional cover layer (not shown in FIG. 1A) may also be provided on second mask layer 12 of mask 10a. The direction of incident radiation is shown by arrow 19. Typically, substrate 17 is glass or fused silica ("quartz"). Spacing layer 18 is typically silicon dioxide, "spin-on-glass", polyimide or any transparent polymer or material.

Figure 2A:
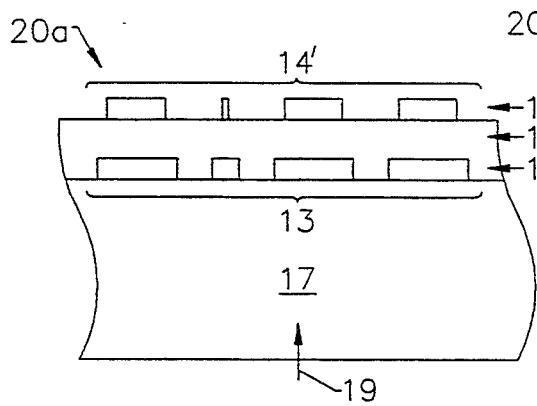
FIGS. 2A and 2B illustrate side cross-sectional views of a second embodiment of a transmissive twin-mask and a reflective twin-mask, respectively, according to the present invention.
Figure 2B:
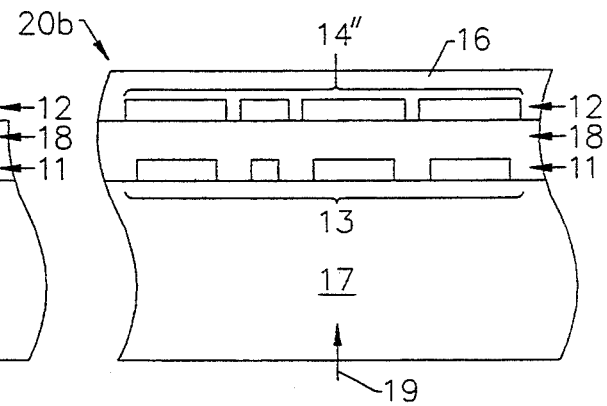

As shown in FIGS. 1A and 1B, the first copy 13 and the second copy 14 are of the same shape and size. FIGS. 2A and 2B illustrate a second embodiment of a transmissive and reflective twin-mask respectively, in which the first and second copies of the mask pattern are of the same shape, but are undersized or oversized relative to the desired size of the patterned features, to provide feature biasing. In particular, FIG. 2A illustrates a transmissive twin-mask 20a in which the features in second copy 14' of the mask pattern are undersized relative to the first copy 13. FIG. 2B illustrates a reflective twin-mask 20b in which the features of second copy 14" are oversized relative to the first copy 13. It will be understood that the features of first copy 13 may also be oversized or undersized compared to that shown in FIG. 1. Feature biasing may be provided to compensate for optical aberrations, improve edge contrast, correct for mask copy interactions or other effects.

Figure 3A:
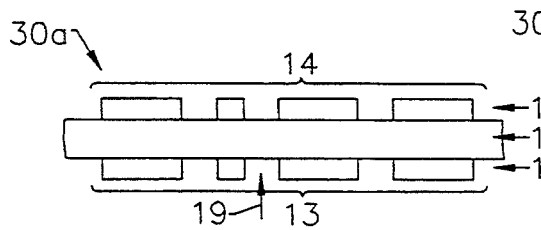
FIGS. 3A and 3B illustrate side cross-sectional views of a third embodiment of a transmissive twin-mask and a reflective twin-mask, respectively, according to the present invention.
Figure 3B:
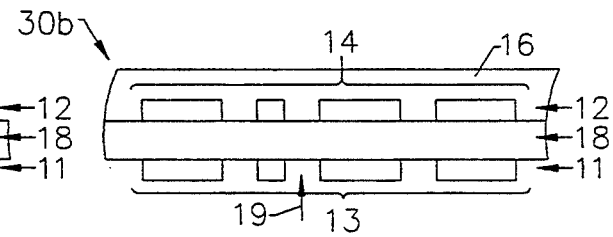

FIGS. 3A and 3B illustrate a third embodiment of a transmissive and reflective twin mask 30a and 30b, respectively. In twin-masks 30a and 30b, spacing layer 18 includes the first copy 13 of the mask pattern formed on one face thereof, and second copy 14 of the mask pattern formed on the opposite face thereof. Substrate 17 is not included.

Figure 4A:
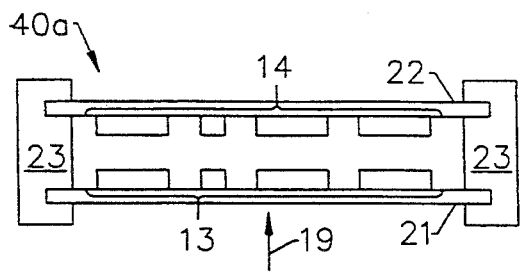
FIGS. 4A and 4B illustrate side cross-sectional views of a fourth embodiment of a transmissive twin-mask and a reflective twin-mask, respectively, according to the present invention.
Figure 4B:
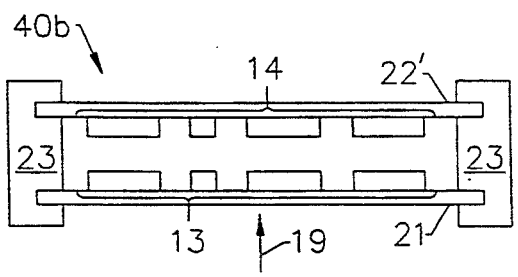

FIGS. 4A and 4B illustrate a fourth embodiment of a transmissive and a reflective twin-mask 40a and 40b, respectively, according to the present invention. As shown, first mask layer including first copy 13 of the mask pattern is formed on a first substrate 21, and second mask layer including a second copy 14 of the mask pattern is formed on a second substrate 22. Support means in the form of a frame 23, maintains the first and second copies 13 and respectively, of the mask pattern, in spaced apart relation and aligned with respect to one another. In reflective twin-mask 40b, substrate 22' is preferably an absorbing substrate.

The configuration of FIGS. 3A and 4A may be particularly useful in a reduction microelectronic substrate patterning system. In particular, in the case of a reduction system, the spacings between the two or more levels of the twin-mask should be on the order of the depth of focus for the particular pattern, multiplied by the magnification squared. For a 5× system, this would yield spacings on the order of tens of microns. Rather than building a twin-mask on a single substrate, with a thick transparent spacing layer therebetween, it may be easier to use two masks back to back. The gap between the masks may be filled with an index matching liquid (not shown). Since no spacing layer or electron beam reregistration is required, fabrication may be simplified. The first and second copies of the mask pattern may be aligned using an interferometer for correct spacing and a microscope for lateral alignment.

It will be understood by those having skill in the art that any of the twin-masks described above may also include a single mask portion, where the increased depth of focus provided by the twin-mask is not necessary or desirable. Alignment marks, not shown in FIGS. 1–4, may also be present for purposes of aligning the first mask layer 11 and the second mask layer 12, or for purposes of positioning the twin-mask in the imaging system. The first and second mask layers 11 and 12 are preferably separated by a distance which is on the order of the desired depth of focus for the microelectronic substrate patterning system multiplied by the magnification squared.

The reflective twin-masks of FIGS. 1B, 2B, 3B and 4B will now be described. In all these figures, the incident illumination 19 is first reflected by first copy 13 of the mask pattern, which is an at least partially reflecting copy and which may be a fully reflecting copy. The second copy 14 of the mask pattern is illuminated through the first copy 13. The second copy of the mask pattern is at least partially reflecting, and is preferably fully reflecting. When using partially coherent illumination, the second copy 14 is illuminated by light that passes unattenuated around the first copy 13 so that first copy may be totally reflecting. Second copy 14 is surrounded by absorbing material 16. The image of the second copy 14 may be slightly degraded due to the fact that the low diffraction orders are attenuated and phase shifted during passage through the first copy 13, whereas the high diffraction orders are not. Qualitatively, this effect should produce a certain amount of edge enhancement for the second copy. This effect becomes less pronounced as the spacing between the two copies increases.

Figure 5:
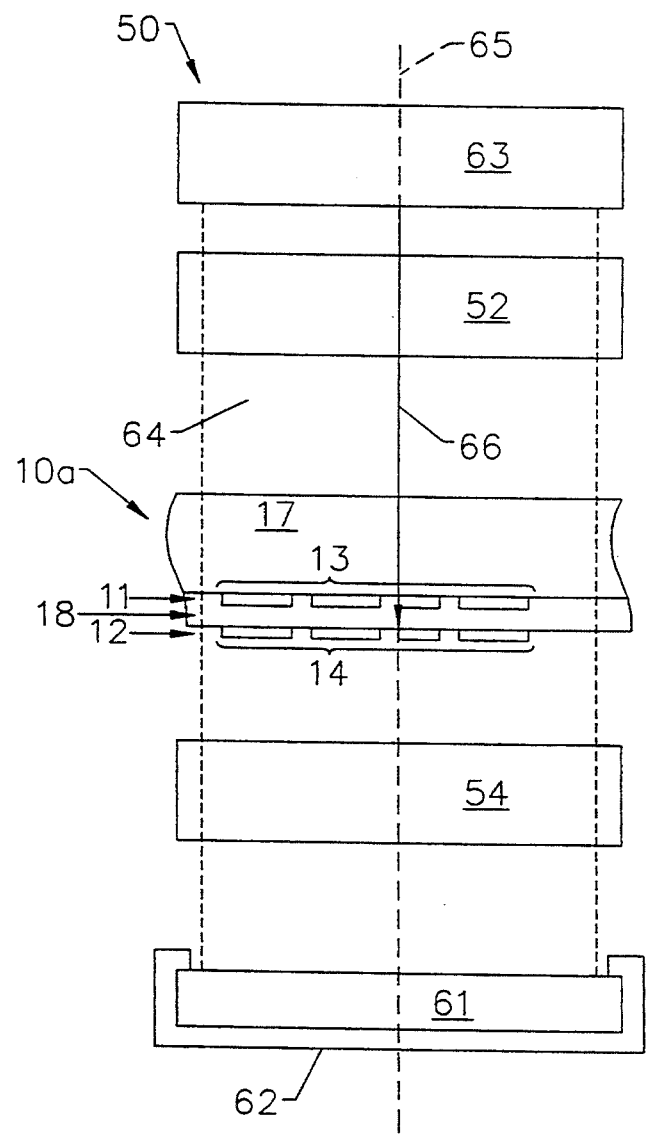
FIG. 5 illustrates the transmissive mask of FIG. 1A in a transmissive microelectronic substrate patterning system according to the present invention.

FIG. 5 illustrates transmissive twin-mask 10a in transmissive patterning system 50. As shown, radiation source 63 directs radiation beam 66 along a radiation path 64 from the radiation source 63 through the transmissive mask 10a and onto microelectronic substrate 61 held in substrate holder 62, via illumination optics 52 and projection optics 54. Thus, the radiation first strikes first copy 13. First copy 13 of mask pattern is an at least partially absorbing copy of the mask pattern and is preferably a totally absorbing copy. The second copy 14 of the mask pattern is a partially absorbing copy of the mask pattern and may be a fully absorbing copy. As also shown in FIG. 5, the second copy 14 is closer to the microelectronic substrate 61 than the first copy 13, such that radiation first impinges upon first copy 13, and then upon second copy 14. A transmissive imaging system is thereby produced.

The transmissive twin-masks of FIGS. 1A, 2A, 3A and 4A are negative resist versions. In these versions, the incident illumination 19 is first absorbed by an almost completely absorbing first copy 13. A second copy 14 underneath the first copy 13 is illuminated by light diffracted around the edges of the first copy 13 and, in the case of partially coherent illumination, by light passing around it. For sparse patterns, the second copy 14 can be made almost completely absorbing as well. For the "complementary" case of a clear window in an opaque area (positive resist), the incident illumination is first transmitted through a clear aperture in an almost completely absorbing copy 13. This first level feature is followed by a clear aperture in a partially absorbing copy 14 underneath it.

Figure 6:
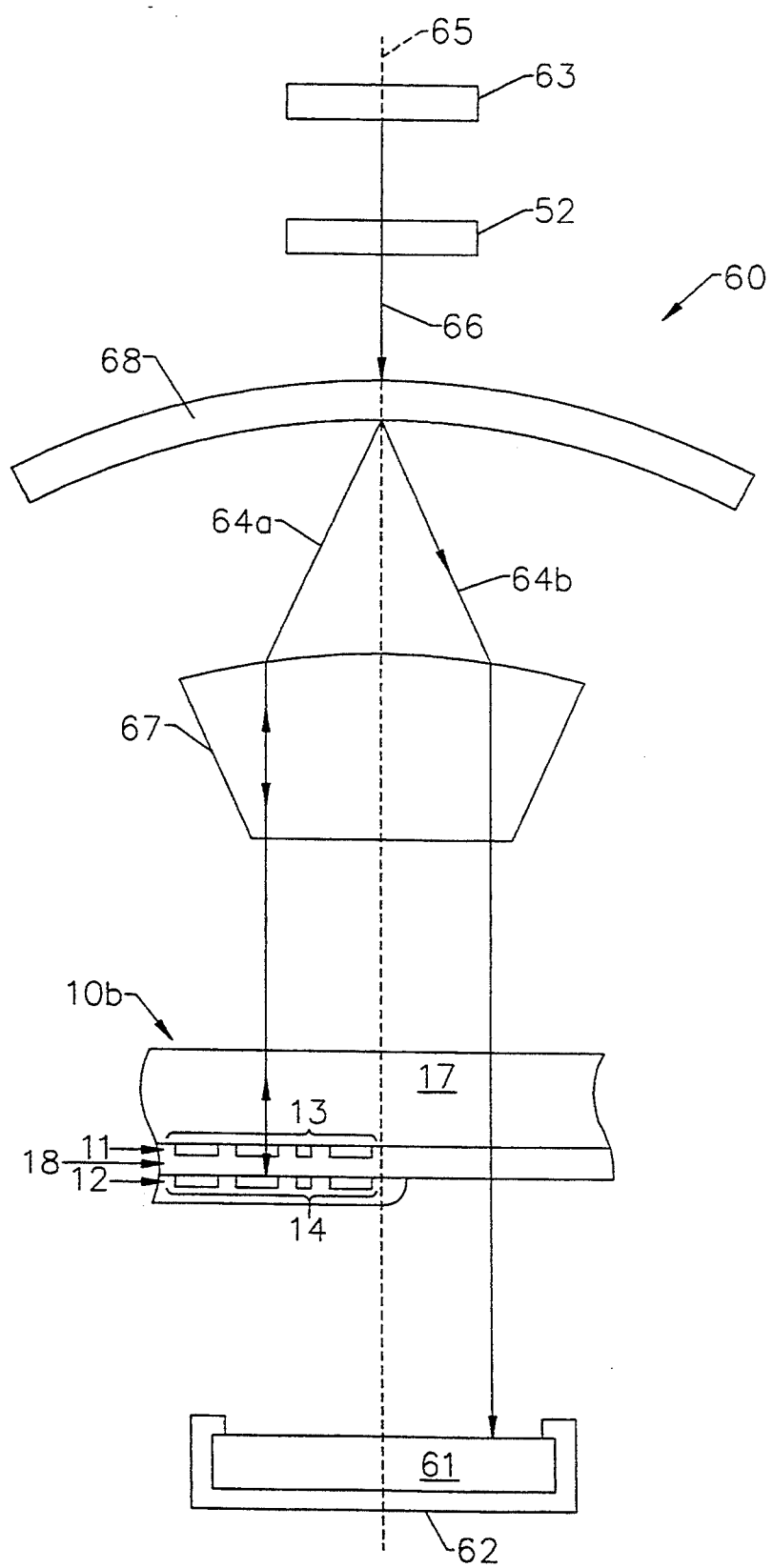
FIG. 6 illustrates the reflective mask of FIG. 1B in a reflective microelectronic substrate imaging system according to the present invention.

FIG. 6 illustrates reflective mask 10b (FIG. 1B) in a reflective-mask microelectronic substrate imaging system 60. Reflective-mask system 60 is a Markle-Dyson system, although other reflective-mask systems can be used. As illustrated in FIG. 6A, a source 63 of radiation directs radiation 66 via illumination optics 52, in a radiation path 64a, 64b along axis 65 of system 60. The design of radiation source 63 and illumination optics 52 are well known to those having skill in the art and will not be described herein further. In the Markle-Dyson system, the radiation 66 passes through a Dyson mirror 68, which is a partially reflecting and partially transmissive mirror having a predetermined curvature. Radiation path 64a continues through a Dyson lens 67 which can be a singlet lens or a doublet lens and which also includes predetermined curvatures. Radiation along the path 64a first impinges upon first copy 13 of the mask pattern and is partially reflected back along path 64a. Thus, the radiation first strikes first copy 13. The unreflected radiation then continues through twin-mask 10b and impinges on second copy 14 of the mask pattern 14, where it is reflected back through path 64a. Upon again striking Dyson mirror 68, the radiation proceeds along path 64b, back through Dyson lens 67 and onto microelectronic substrate 61 which is held in substrate holder 62, passing through a clear window in mask 10b.

There are at least two different methods for fabricating a twin-mask according to the present invention. A first method makes use of the fact that the two copies of the mask pattern are substantially identical so that both copies may be patterned through the same photoresist mask. The advantage of this method is that only one resist exposure is required. Unfortunately, in many cases, the resulting aspect ratios are large and a highly anisotropic etch would be needed. For example, aspect ratios as large as 4:1 may be necessary and may be difficult to obtain using conventional etching process.

The second method patterns the two copies of the mask patterns in two separate steps. In the first mask pattern copy forming step, alignment marks preferably are formed, to be used for registration in the second copy forming step. An advantage of this method is that only standard thicknesses of films need to be patterned, with moderate aspect ratios. Also, the two copies of the mask pattern do not necessarily have to be the same. Thus, depth enhanced features and unenhanced features can be present on the same mask. Also, biased (oversized or undersized) features may be selectively provided on one of the two layers. Such a method will now be described.

Figure 7A:
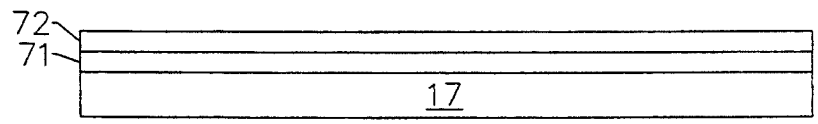
FIGS. 7A–7O illustrate side cross-sectional views of the twin-mask of FIG. 1 during intermediate fabrication steps.
Figure 7B:
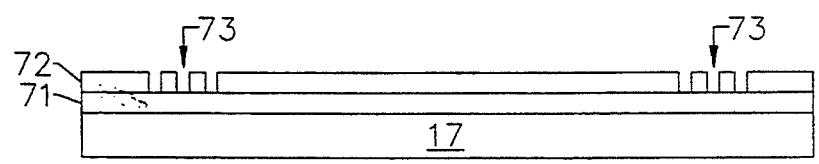
Figure 7C:
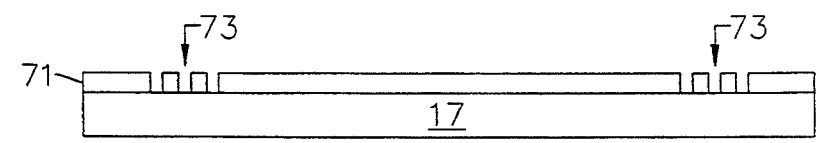
Figure 7D:
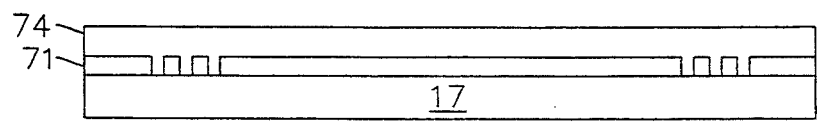
Figure 7E:
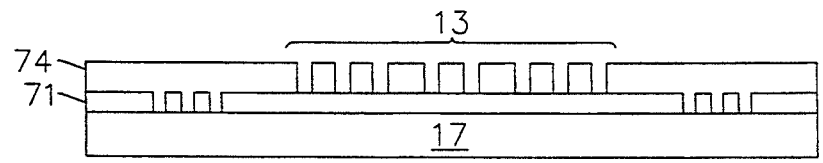
Figure 7F:
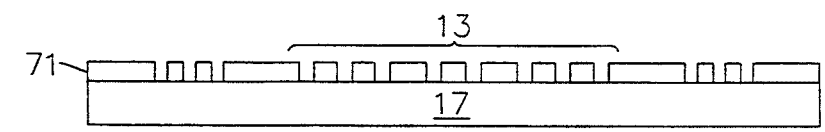
Figure 7G:
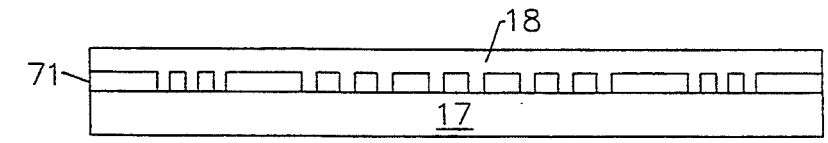
Figure 7H:
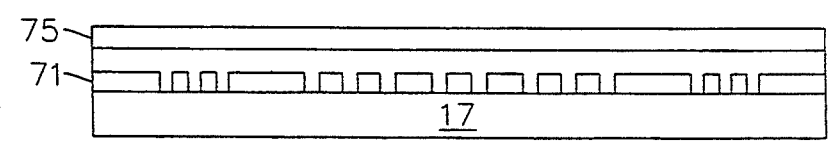
Figure 7I:
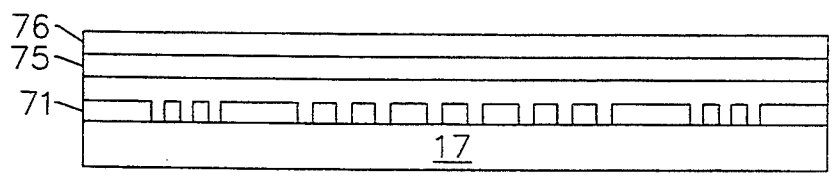
Figure 7J:
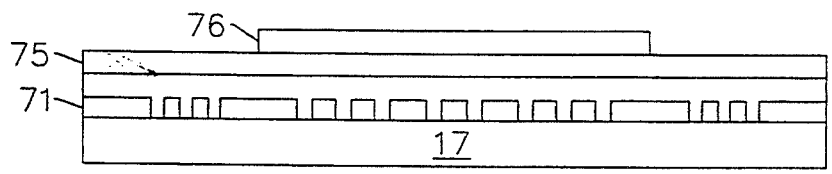
Figure 7K:
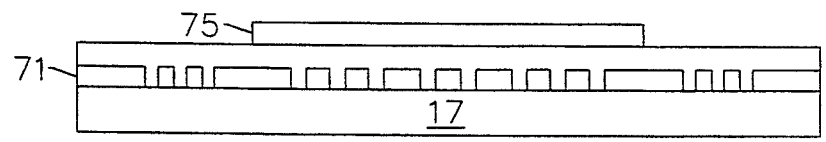
Figure 7L:
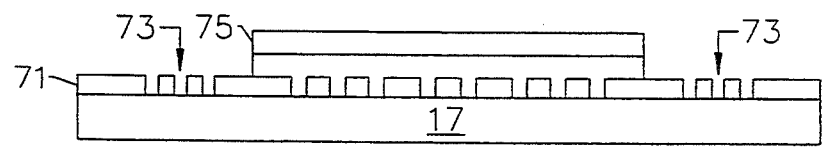
Figure 7M:
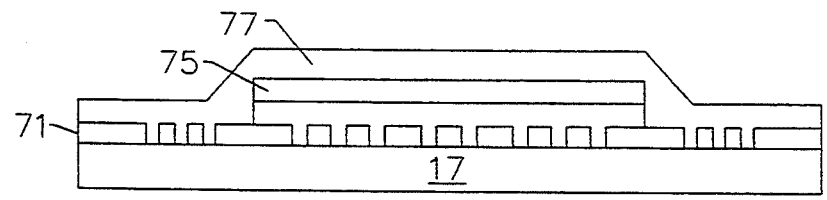
Figure 7N:
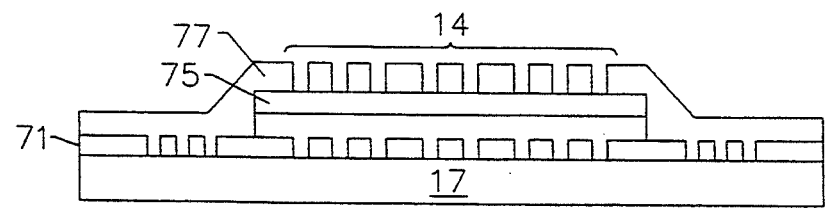
Figure 7O:
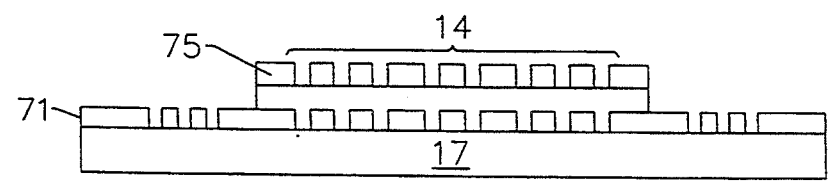

FIGS. 7A-7O illustrate cross-sectional views of twin-mask 10a (FIG. 1A) during intermediate fabrication steps. For simplicity, the reflector and absorber materials are assumed to be chromium, with different thicknesses being used for differing amounts of reflectivity and absorptivity as is well known to those having skill in the art.

Referring to FIG. 7A, a fused silica mask blank 17 is coated with a layer of chromium 71 and a layer of electron beam resist 72. Referring to FIG. 7B, alignment marks 73 are exposed in the resist 72. The resist 72 is developed. Referring to FIG. 7C, the chromium layer 71 is etched and the resist layer 72 is stripped. Then, referring to FIG. 7D, a second layer 74 of electron beam resist is spun on. In FIG. 7E, the first copy 13 of the mask pattern is exposed in the second resist layer 74 using electron beam exposure.

Referring to FIG. 7F, the chromium 73 is then etched again, to produce first copy 13 therein, and the resist 74 is stripped. Referring now to FIG. 7G, a spacing layer 18 of silicon dioxide is deposited, for example using chemical vapor deposition.

Referring to FIG. 7H, a second layer of chromium 75 is evaporated, corresponding to the thickness of the second copy 14. A layer of resist 76 is spun on at FIG. 7I. The resist 76 is exposed optically and is developed as shown in FIG. 7J. The chromium layer 75 is then etched and resist 76 is stripped as shown in FIG. 7K. The silicon dioxide layer 18 is then etched in hydrofluoric acid or using reactive ion etching to expose the alignment marks 73 as shown in FIG. 7L.

Another layer of electron beam resist 77 is then spun on as shown in FIG. 7M, and the resist layer 77 is exposed to develop the second copy 14 of the mask pattern using the alignment marks 73 for alignment. Finally, the second chromium layer 75 is etched in FIG. 7N and the resist is stripped to form the mask shown in FIG. 7O.

In the case of a reflective twin-mask, the top surface, which will act as the backside of the mask, is preferably covered with an absorber material 16.

It will be understood by those having skill in the art that almost all of the individual steps of FIGS. 7A-7O are commonplace in the fabrication of masks. The only steps that are not commonly used in the production of lithographic photomasks are the deposition of silicon dioxide (FIG. 7G) and the alignment between two pattern levels (FIG. 7N). However, these steps are common microelectronic fabrication steps. The overall complexity of the process described above appears comparable to or only slightly more complicated than the process required for manufacturing phase shifting masks.

It will be understood that chromium has been used as the reflector material because most lithographic photomasks use chromium as an absorber, and as a consequence, the patterning of chromium is very well understood. Because of its higher bulk reflectivity, aluminum may be a better reflector material to use. Silicon or other materials may also be used. Likewise silicon dioxide was chosen as an example for a spacing layer material. Other materials, such as polyimide or other transparent polymers may be used.

For a given mask pattern to be imaged, there are several parameters that have to be chosen prior to fabrication of a twin-mask. These include the thickness of the spacer layer 18 between the two mask layers 11 and 12, the transmissivities of the opaque regions in each of the two layers of a transmissive twin-mask, and the reflectivities of the reflecting regions in each of the two layers of a reflective mask. Typically, this results in three parameters that have to be chosen in either the transmissive or the reflective configuration: the thickness of first mask layer 11, the thickness of second mask layer 12, and the spacing between mask layers 11 and 12. It will be understood that none of these parameters has to be constant over the area of the mask. In other words, both the spacing and the thickness of the absorber or reflector materials may be deliberately chosen to be different in different regions of the mask, depending, for example, on the local density of the pattern.

There are at least two different approaches for selecting the above described parameters for a given mask pattern. The first approach is empirical, and involves selecting reasonable starting values for the thicknesses and spacing and evaluating the performance of masks with different film thickness and spacing combinations experimentally. The thickness of the first and second copies may be chosen such that the images of the first and second copies have about the same intensity. The separation between the first and second copies should preferably be large enough to obtain benefit from the twin-mask compared to a single mask, but not so large that the twin images separate. In practice, such an approach may lead to a suitable choice of parameters for most patterns after relatively few iterations.

A second, more systematic approach calculates the expected image from a given twin-mask structure using computer simulations. One possibility is the use of existing simulation programs, such as TEMPEST and SPLAT which are publicly available programs developed at the University of California at Berkeley. TEMPEST calculates the amplitude of an electromagnetic wave diffracted by a periodic three-dimensional structure. SPLAT simulates partially coherent imaging in an optical projection system. Together the two programs can yield accurate predictions of the image intensity due to an arbitrary twin-mask structure. The drawback of this approach is that the calculations are computationally so involved that they can presently be performed in a reasonable amount of time only for very simple structures.

Due to the particular structure of twin-masks, there are, however, several simplifying assumptions that can markedly reduce the computation time required. While Kirchhoff boundary conditions and the scalar wave approximation may not be applicable to the twin-mask structure as a whole, each individual layer of a twin-mask may be adequately modeled using these approximations. Thus, repeated application of Kirchhoff boundary conditions and formulas for the propagation of a scalar wave in the uniform medium between the two mask layers can yield a fairly accurate prediction of the fields diffracted from a twin mask structure. In general, this will result in diffraction amplitudes of the various diffraction orders that are a function of angle of incidence of the illumination. This dependence on illumination angle may preclude the use of the widely used Hopkins approach to imaging simulation. Instead, the contribution to the image intensity due to individual, mutually incoherent, source points may be calculated, and the resulting partial image intensities may be added to obtain the fields.

Accordingly, a twin-mask method and system of the present invention provides a mask-based solution to the depth of focus problem. While requiring no changes to the optical system itself, it combines the flexibility of phase-shifting masks with the conceptual simplicity of the FLEX approach. The concept is applicable both to conventional transmissive-mask systems and to reflective-mask systems such as the Markle-Dyson design. Topography compensation may also be applied to all or part of each or both mask copies. Reflectivity or transmissivity need not be maintained uniform across each mask copy, to provide added flexibility.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A mask for use in patterning microelectronic substrates, said mask comprising:
   a first mask layer including a first copy of a microelectronic substrate mask pattern therein;
   a second mask layer including a second copy of said microelectronic substrate mask pattern therein; and
   means for fixedly supporting said first and second copies of said microelectronic substrate mask pattern in spaced apart relation to one another, and aligned relative to one another.

2. The mask of claim 1 wherein said first copy is of same shape and size as said second copy.

3. A mask for use in patterning microelectronic substrates, said mask comprising:
   a first mask layer including a first copy of a microelectronic substrate mask pattern therein;
   a second mask layer including a second copy of said microelectronic substrate mask pattern therein; and
   means for supporting said first and second copies of said microelectronic substrate mask pattern in spaced apart relation to one another, and aligned relative to one another;
   wherein said first copy is of same shape as said second copy but biased in size relative thereto.

4. The mask of claim 1 wherein said first copy is an at least partially absorbing copy of said microelectronic substrate mask pattern and wherein said second copy is an at least partially absorbing copy of said microelectronic substrate mask pattern, to form a transmissive twin-mask.

5. The mask of claim 4 wherein at least one of said first and second copies are fully absorbing copies of said microelectronic substrate mask pattern.

6. A mask for use in patterning microelectronic substrates, said mask comprising:
   a first mask layer including a first copy of a microelectronic substrate mask pattern therein;
   a second mask layer including a second copy of said microelectronic substrate mask pattern therein; and
   means for supporting said first and second copies of said microelectronic substrate mask pattern in spaced apart relation to one another, and aligned relative to one another;
   wherein said first copy is an at least partially reflecting copy of said microelectronic substrate mask pattern and wherein said second copy is an at least partially reflecting copy of said microelectronic substrate mask pattern, to form a reflective twin-mask.

7. The mask of claim 6 wherein said at least one of first and second copies are totally reflecting copies of said microelectronic substrate mask pattern.

8. A mask for use in patterning microelectronic substrates, said mask comprising:
   a first mask layer including a first copy of a microelectronic substrate mask pattern therein;
   a second mask layer including a second copy of said microelectronic substrate mask pattern therein; and
   means for supporting said first and second copies of said microelectronic substrate mask pattern in spaced apart relation to one another, and aligned relative to one another;
   wherein said supporting means comprises a spacing layer between said first mask layer and said second mask layer, for supporting said first and second copies of said microelectronic substrate mask pattern in spaced apart relation to one another, and aligned relative to one another.

9. The mask of claim 8 wherein said spacing layer includes first and second opposing faces, wherein said first mask layer is on said first opposing face and wherein said second mask layer is on said second opposing face.

10. The mask of claim 9 further comprising a substrate on said first mask layer opposite said spacing layer.

11. The mask of claim 10 further comprising an absorbing layer on said second mask layer opposite said spacing layer.

12. A mask for use in patterning microelectronic substrates, said mask comprising:

a first mask layer including a first copy of a microelectronic substrate mask pattern therein;

a second mask layer including a second copy of said microelectronic substrate mask pattern therein; and means for supporting said first and second copies of said microelectronic substrate mask pattern in spaced apart relation to one another, and aligned relative to one another;

wherein said supporting means comprises a frame between said first mask layer and said second mask layer, for supporting said first and second copies of said microelectronic substrate mask pattern in spaced apart relation to one another, and aligned relative to one another.

13. The mask of claim 1 wherein at least one of said first and second mask layers include alignment marks.

14. A method of patterning a microelectronic substrate comprising the steps of:

placing a first copy of a mask pattern and a second copy of said mask pattern in a radiation path from a radiation source to a microelectronic substrate, in axially spaced apart relation to one another along the radiation path and in fixed axial alignment to one another along the radiation path; and directing radiation along the radiation path from the radiation source to the microelectronic substrate such that said mask pattern is imaged onto said microelectronic substrate as a result of interaction of the radiation with both said first copy and said second copy of said mask pattern in the radiation path.

15. The method of claim 14 wherein said placing step comprises the step of placing in the radiation path, a mask having a first mask layer including said first copy of a mask pattern therein, a second mask layer including said second copy of said mask pattern therein, and means for fixedly supporting said first and second copies of said mask pattern in spaced apart relation to one another, and aligned relative to one another, such that said first copy and said second copy are in axially spaced apart relation to one another along the radiation path and in axial alignment to one another along the radiation path.

16. A method of patterning a microelectronic substrate comprising the steps of:

placing a first copy of a mask pattern and a second copy of said mask pattern in a radiation path from a radiation source to a microelectronic substrate, in axially spaced apart relation to one another along the radiation path and in axial alignment to one another along the radiation path; and directing radiation along the radiation path from the radiation source to the microelectronic substrate such that said mask pattern is imaged onto said microelectronic substrate as a result of interaction of the radiation with both said first copy and said second copy of said mask pattern in the radiation path;

wherein said first copy of a mask pattern is an at least partially reflecting copy of said mask pattern, wherein said second copy of said mask pattern is an at least partially reflecting copy of said mask pattern, and wherein said placing step comprises the step of placing said first and said second copy in said radiation path such that radiation first impinges on said first copy, and then on said second copy, to produce a reflective patterning method.

17. The method of claim 16 wherein at least one of said first and second copies of said mask pattern is a completely reflecting copy of said mask pattern.

18. The method of claim 14 wherein said first copy of a mask pattern is an at least partially absorbing copy of said mask pattern, wherein said second copy of said mask pattern is an at least partially absorbing copy of said mask pattern, and wherein said placing step comprises the step of placing said first and said second copy in said radiation path such that radiation first impinges on said first copy, and then on said second copy, to produce a transmissive patterning method.

19. The method of claim 18 wherein at least one of said first and said second copies of said mask pattern is a completely absorbing copy of said mask pattern.

20. A system for patterning a microelectronic substrate, comprising:

means for directing radiation along a radiation path;

means for holding a microelectronic substrate in said radiation path to impinge said radiation thereon;

a first copy of a mask pattern in said radiation path between said radiation directing means and said microelectronic substrate holding means; and a second copy of said mask pattern in said radiation path between said radiation directing means and said microelectronic substrate holding means, in fixed axially spaced apart relation from said first copy along the radiation path and in fixed axial alignment with said first copy along the radiation path, such that said mask pattern is imaged onto said microelectronic substrate as a result of interaction of said radiation with both said first copy and said second copy of said mask pattern in the radiation path.

21. The system of claim 20 further comprising means for fixedly supporting said first and second copies of said mask pattern in spaced apart relation to one another, and aligned relative to one another.

22. A system for patterning a microelectronic substrate, comprising:

means for directing radiation along a radiation path;

means for holding a microelectronic substrate in said radiation path to impinge said radiation thereon;

a first copy of a mask pattern in said radiation path between said radiation directing means and said microelectronic substrate holding means; and a second copy of said mask pattern in said radiation path between said radiation directing means and said microelectronic substrate holding means, in axially spaced apart relation from said first copy along the radiation path and in axial alignment with said first copy along the radiation path, such that said mask pattern is imaged onto said microelectronic substrate as a result of interaction of said radiation with both said first copy and said second copy of said mask pattern in the radiation path;

wherein said first copy of a mask pattern is an at least partially reflecting copy of said mask pattern, wherein said second copy of said mask pattern is an at least partially reflecting copy of said mask pattern, the radiation path first impinging on said first copy and then on said second copy, to produce a reflective patterning system.

23. The system of claim 22 wherein at least one of said first and second copies of said mask pattern is a completely reflecting copy of said mask pattern.

24. The system of claim 20 wherein said first copy of a mask pattern is an at least partially absorbing copy of said mask pattern, wherein said second copy of said mask pattern is an at least partially absorbing copy of said mask pattern, the radiation path first impinging on said first copy and then on said second copy, to produce a transmissive patterning system.

25. The system of claim 24 wherein at least one of said first and second copies of said mask pattern is a completely absorbing copy of said mask pattern.

26. The system of claim 20 further comprising a microelectronic substrate coupled to said holding means.

27. A method of fabricating a mask for use in patterning microelectronic substrates, comprising the steps of:
forming a first mask layer, including a first copy of a microelectronic substrate mask pattern therein, on a radiation transparent substrate;
forming a radiation transparent spacer layer on said first mask layer, opposite said radiation transparent substrate; and
forming a second mask layer including a second copy of said microelectronic substrate mask pattern therein, on said radiation transparent spacer layer opposite said first mask layer, and aligned relative to said first copy of a microelectronic substrate mask pattern.

28. The method of claim 27 wherein said second mask layer forming step is preceded by the step of forming alignment marks in said first mask layer; and wherein said second mask layer forming step comprises the step of using said alignment marks to align said second copy relative to said first copy.

29. The method of claim 27 wherein said second mask layer forming step comprises the step of forming a second mask layer including a second copy of said microelectronic substrate mask pattern therein, which is of same shape and size as said first copy.

30. The method of claim 27 wherein said second mask layer forming step comprises the step of forming a second mask layer including a second copy of said microelectronic substrate mask pattern therein, which is of same shape as said first copy, but which is biased in size relative to said second copy.

* * * * *